United States Patent
Song et al.

(10) Patent No.: US 10,847,449 B2
(45) Date of Patent: Nov. 24, 2020

(54) LEAD FRAME WITH SELECTIVE PATTERNED PLATING

(71) Applicant: NXP USA, INC., Austin, TX (US)

(72) Inventors: Meijiang Song, Tianjin (CN); Allen Marfil Descartin, Tianjin (CN); Mariano Layson Ching, Jr., Tianjin (CN); Lidong Zhang, Tianjin (CN); Jun Li, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/368,573

(22) Filed: Mar. 28, 2019

(65) Prior Publication Data
US 2020/0203258 A1 Jun. 25, 2020

(30) Foreign Application Priority Data
Dec. 19, 2018 (CN) .......................... 2018 1 1558851

(51) Int. Cl.
*H01L 23/495* (2006.01)
(52) U.S. Cl.
CPC .... *H01L 23/4951* (2013.01); *H01L 23/49541* (2013.01); *H01L 23/49575* (2013.01); *H01L 23/49582* (2013.01)
(58) Field of Classification Search
None
See application file for complete search history.

(56) References Cited

U.S. PATENT DOCUMENTS

| | | |
|---|---|---|
| 4,033,844 A | 7/1977 | Pantiga et al. |
| 4,289,922 A | 9/1981 | Devlin |
| 5,221,859 A | 6/1993 | Kobayashi et al. |
| 5,339,518 A | 8/1994 | Tran et al. |
| 5,378,657 A | 1/1995 | Lin |
| 5,403,465 A | 4/1995 | Apperson et al. |
| 5,633,528 A | 5/1997 | Abbott et al. |
| 2014/0319663 A1* | 10/2014 | Shibasaki ........... H01L 21/4828 257/670 |

OTHER PUBLICATIONS

Chin Wai Lum, "Low Profile Tsop Approach for MSL 1 Delamination", Electronic Manufacturing Technology Symposium (IEMT), 2010 34th IEEE/CPMT International.

\* cited by examiner

*Primary Examiner* — Moazzam Hossain
*Assistant Examiner* — Stanetta D Isaac

(57) ABSTRACT

A copper lead frame used in the assembly of a semiconductor device includes a die flag and lead fingers extending away from the die flag. Each lead finger has a proximal end near the die flag and a distal end further away from the die flag. Metal plating is formed on the lead fingers, where first lead fingers have the metal plating on their proximal ends and second lead fingers have the metal plating on their distal ends. The first and second lead fingers are arranged alternately around the die flag.

19 Claims, 2 Drawing Sheets

LEAD FRAME WITH SELECTIVE PATTERNED PLATING

BACKGROUND

The present invention relates to semiconductor device packaging, and more particularly, to a lead frame used in semiconductor device packaging.

Copper based lead frames are used for packaging many different types of semiconductor devices, such as QFN, QFP, LQFP, SOIC, etc. With copper based lead frames, silver or another metal is plated on the leads to allow bond wires to be securely attached to the lead tips. However, the adhesion between mold compound and the plating metal is not as good as that between mold compound and copper, such that delamination between the mold compound and the plating metal can occur during reliability stress testing (e.g., temp cycling), resulting in cracking of the wire bond and thus, an electrical open failure.

While it is known to use surface roughening to improve mold compound delamination, such roughening does not improve wire bondability and it adds cost. Accordingly, it would be advantageous to be able to avoid delamination during stress testing or temperature cycling of an integrated circuit device without adding cost or impacting wire bondability.

SUMMARY

In one embodiment, the present invention provides a lead frame for assembling a semiconductor device. The lead frame, which is formed of copper, includes a die flag and a plurality of lead fingers spaced from and extending away from the die flag. Each lead finger has a proximal end near to the die flag and a distal end that is further away from the die flag. A metal plating is added to the proximal and distal ends of the lead fingers in an alternating fashion.

In another embodiment, the present invention is a packaged semiconductor device comprising the lead frame with alternately plated lead ends, an integrated circuit die attached to the die flag and electrically connected to the plated lead ends, and a mold compound encapsulating the lead frame, die and electrical connections.

DESCRIPTION OF THE DRAWINGS

Embodiments of the invention will become more fully apparent from the drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
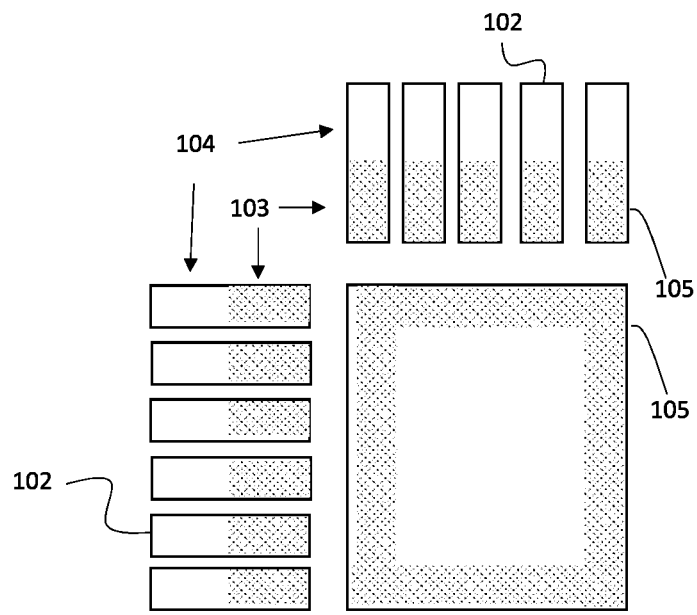
FIG. 1 is a top plan view of a portion of a conventional lead frame of a semiconductor device.

Referring now to FIG. 1, a top plan view of a portion of a conventional lead frame 100 of a semiconductor device is shown. The lead frame 100 comprises a die flag 101 and several lead fingers 102. The lead fingers 102 are generally perpendicular to and extend away from the die flag 101. Each lead finger 102 has a proximal end 103 that is near the die flag 101 and a distal end 104 that is further away from the die flag 101. The die flag 101 and lead fingers 102 typically are made of copper, such as by stamping or etching a copper sheet. In order to allow for secure wire bonds, the proximal ends 103 of the lead fingers 102 are plated with silver because bond wires (not shown) are attached at the proximal ends 103 of the lead fingers 102. The outer edge area of flag 101 also may be plated with silver to allow for down bonds (i.e., ground wires). The plating is indicated as 105. However, as previously discussed, conventional silver plating on the lead frame to support wire bonding can cause delamination of an overlying encapsulation material.

Figure 2:
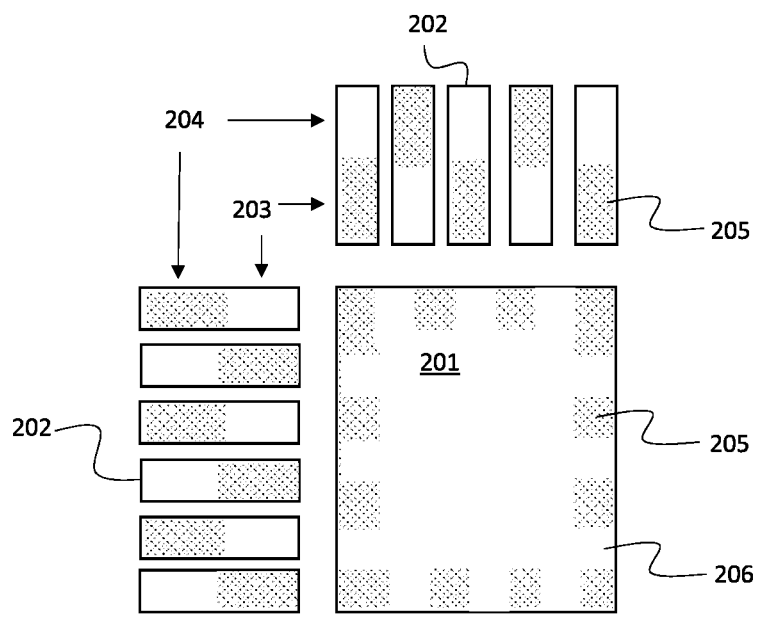
FIG. 2 is a top plan view of a portion of a lead frame of a semiconductor device according to one embodiment of the present invention.

FIG. 2 is a top plan view of a lead frame 200 for a semiconductor device according to one embodiment of the present invention. The lead frame 200 comprises a die receiving area 201 surrounded by a plurality of lead fingers 202. In the embodiment shown, the die receiving area 201 comprises a die flag, which is a planar piece of copper foil or sheeting. However, in other embodiments, such as exposed die packages, the die receiving area 201 may be empty or comprises a piece of tape located on a backside of the lead frame temporarily during the assembly process. The lead fingers 202 are generally perpendicular to and extend away from the die receiving area 201. Each lead finger 202 has a proximal end 203 that is near the die receiving area 201 and a distal end 204 that is further away from the die receiving area 201.

The die receiving area 201, if it comprises a flag, and the lead fingers 202 are made of copper, such as by stamping, cutting or etching, as is known in the art.

Metal plating 205 is formed on the lead fingers 202 and, when there is a die flag, on the die flag also. However, unlike in the conventional lead frame 100, the plating is formed on the proximal ends 203 of alternate leads 202, and on the distal ends 204 of the leads that are adjacent to the leads with plating on the proximal ends. Thus, the leads 202 comprise a first group of leads with the plating 205 on their proximal ends 203 and a second group of leads with the plating 205 on their distal ends 204, where the lead fingers of the first group and the lead fingers of the second group are disposed alternately around the die flag. By alternating the location of the plating, the adhesion between a mold compound and the lead frame is enhanced.

When the die receiving area 201 comprises a die flag, then instead of plating the entire outer edge of the flag, the plating thereon is broken up by gaps 206. The gaps 206 in the plating 205 further improve mold compound adhesion. wherein the gaps are evenly spaced from each other. In one embodiment, the metal plating 205 comprises silver.

Figure 3:
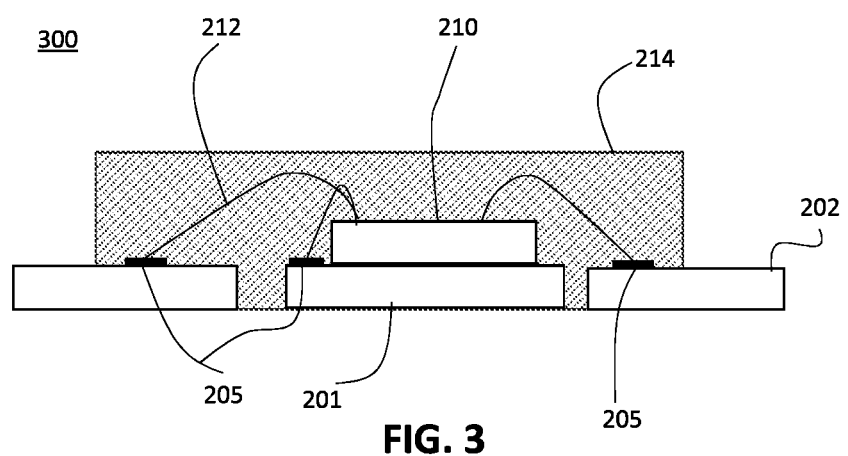
FIG. 3 is a side cross-sectional view of a portion of a semiconductor device according to an embodiment of the present invention.

FIG. 3 is a side, cross-sectional view of a packaged semiconductor device 300 in accordance with an embodiment of the present invention. The packaged semiconductor device 300 is assembled using the lead frame 200 of FIG. 2, which comprises a plurality of lead fingers 202 arranged around a die flag 201. The lead fingers 202 are generally perpendicular to and extend away from the die flag 201. Each lead finger 202 has a proximal end 203 that is spaced from but near the die flag 201 and a distal end 204 that is further away from the die flag 201.

Metal plating 205 is formed on the lead fingers 202 in different places on alternate lead fingers. That is, first lead fingers have the metal plating 205 on their proximal ends and second lead fingers have the metal plating 205 on their distal ends, and the first and second lead fingers are disposed alternately around the die flag 201. An integrated circuit die 210 is disposed in the die receiving area, and, more particularly, is attached to a top surface of the die flag 201 with a die attach adhesive or tape (not shown). The die 210 may comprise any type of die such as a custom logic circuit, a system on a chip, or a microcontroller. Electrical connectors 212, which in the embodiment shown are bond wires, connect bonding pads on a top surface of the die 210 with respective ones of the lead fingers 205. Of course, the electrical connectors 212 contact the metal plating 205 on the first and second lead fingers 202. An encapsulation material 214 covers the die 210, the electrical connectors 212 and the lead fingers 202. Note that for a QFP, for example, the "distal end" as regards the plating is not the lead tip that extends beyond the package body formed by the encapsulant 214, but rather the "distal end" is a location within the mold compound but offset from the "proximal end" of the adjacent lead finger where the bond wire 212 is bonded to the lead finger 202.

The die flag 201 includes plated and unplated portions disposed around its perimeter on its top surface, as shown in FIG. 2.

In the presently preferred embodiment, the lead frame 200 is formed from a sheet of copper or a copper foil. The features of the lead frame, such as the die flag and leads (as well as tie bars and end bars) may be formed by cutting, stamping or etching, as is known in the art. The plated areas described above comprise silver plating. However, other areas of the lead frame may comprise the same or other plating. For example, the exposed ends of the leads that extend beyond the body formed by the encapsulation material may be plated to prevent corrosion. Other plating metals or alloys also may be used.

The present invention achieves a 'locking effect' because it stops delamination propagation and thus enhances the delamination performance of a device assembled with the metal plated lead frame.

Although the invention has been described in the context of IC packages having a single die and a single type of electrical connection (i.e., bond wires), it will be understood that the invention can be implemented in the context of IC packages having any suitable number of dies and any suitable number of types of electrical connections.

Also for purposes of this description, the terms "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Unless explicitly stated otherwise, each numerical value and range should be interpreted as being approximate as if the word "about" or "approximately" preceded the value or range.

It will be understood that various changes in the details, materials, and arrangements of the parts which have been described and illustrated in order to explain embodiments of this invention may be made by those skilled in the art without departing from embodiments of the invention encompassed by the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A lead frame for assembling a semiconductor device, comprising:
   a die flag;
   lead fingers extending away from the die flag, each lead finger having a proximal end that is near the die flag and a distal end that is further away from the die flag, wherein the die flag and the lead fingers comprise copper; an
   metal plating formed on the lead fingers, wherein first lead fingers have the metal plating on the proximal ends and not on the distal ends and second lead fingers have the metal plating on the distal ends and not on the proximal ends.

2. The lead frame of claim 1, wherein the first and second lead fingers are disposed alternately around the die flag.

3. The lead frame of claim 1, wherein the die flag includes metal plating.

4. The lead frame of claim 3, wherein the die flag metal plating extends around a rim of the die flag.

5. The lead frame of claim 4, wherein the die flag metal plating has a plurality of gaps formed therein.

6. The lead frame of claim 5, wherein the gaps are evenly spaced from each other.

7. The lead frame of claim 1, wherein the metal plating comprises silver.

8. A lead frame for assembling a semiconductor device, comprising:
   a plurality of lead fingers arranged around a die receiving area, wherein the lead fingers extend away from the die receiving area, wherein each lead finger has a proximal end that is near the die receiving area and a distal end that is further away from the die receiving area, and wherein the lead fingers comprise copper; and
   metal plating formed on the lead fingers, wherein first lead fingers have the metal plating on the proximal ends and not on the distal ends and second lead fingers have the metal plating on the distal ends and not on the proximal ends.

9. The lead frame of claim 8, wherein the first and second lead fingers are disposed alternately around the die receiving area.

10. The lead frame of claim 9, further comprising a die flag disposed in the die receiving area, wherein the die flag comprises copper.

11. The lead frame of claim 10, wherein the die flag includes metal plating that extends around a perimeter thereof and on a top surface thereof, and the die flag metal plating has a plurality of gaps formed therein that are evenly spaced from each other.

12. A packaged semiconductor device, comprising:
   a plurality of lead fingers arranged around a die receiving area, wherein the lead fingers extend away from the die receiving area, wherein each lead finger has a proximal end that is near the die receiving area and a distal end that is further away from the die receiving area, and wherein the lead fingers comprise copper; and
   metal plating formed on the lead fingers, wherein first lead fingers have the metal plating on the proximal ends and not on the distal ends and second lead fingers have the metal plating on the distal ends and not on the proximal ends;
   an integrated circuit die disposed in the die receiving area;
   electrical connectors connecting bonding pads on a surface of the die with respective ones of the lead fingers, wherein the electrical connectors contact the metal plating on the first and second lead fingers; and
   an encapsulation material that covers the die, the electrical connectors and the lead fingers.

13. The packaged semiconductor device of claim 12, wherein the first and second lead fingers are disposed alternately around the die receiving area.

14. The packaged semiconductor device of claim 13, further comprising a die flag disposed in the die receiving area, wherein the die flag comprises copper and the die is attached to a top surface of the die flag.

15. The packaged semiconductor device of claim 14, wherein the die flag includes metal plating.

16. The packaged semiconductor device of claim 15, wherein the die flag metal plating extends around a perimeter of the die flag and on a top surface thereof.

17. The packaged semiconductor device of claim 16, wherein the die flag metal plating has a plurality of gaps formed therein.

18. The packaged semiconductor device of claim 17, wherein the gaps are evenly spaced from each other.

19. The packaged semiconductor device of claim 15, wherein the metal plating comprises silver.

\* \* \* \* \*